United States Patent [19]

Nguyen Minh et al.

[11] Patent Number: 4,626,880
[45] Date of Patent: Dec. 2, 1986

[54] VERTICAL MOS-FET DEVICES HAVING A PLANAR MULTICELL STRUCTURE

[75] Inventors: Chau Nguyen Minh; Bernard Vertongen, both of Caen, France

[73] Assignee: U.S. Philips Corporation, New York, N.Y.

[21] Appl. No.: 558,234

[22] Filed: Dec. 5, 1983

[30] Foreign Application Priority Data

Dec. 8, 1982 [FR] France .................. 82 20554

[51] Int. Cl.$^4$ .......................................... H01L 29/10
[52] U.S. Cl. ........................................ 357/23.4; 357/41
[58] Field of Search ............ 357/86, 23.4, 22, 23.1, 357/23.3, 23.8, 23.14, 55, 41

[56] References Cited

U.S. PATENT DOCUMENTS

| 4,072,975 | 2/1978 | Ishitani ...................... 357/23.4 |
| 4,148,047 | 4/1979 | Hendrickson .............. 357/23.4 |
| 4,345,265 | 8/1982 | Blanchard .................. 357/23.4 |

FOREIGN PATENT DOCUMENTS

| 8202981 | 9/1982 | PCT Int'l Appl. ............ 357/23.4 |
| 2082385 | 3/1982 | United Kingdom .......... 357/23.4 |

OTHER PUBLICATIONS

Tihanyi, "Functional Integration of Power MOS and Bipolar Devices", Electron Devi., 1980 IEEE, pp. 75–78.
Design News, "High-Powered P-Channel M.O.S. F.E.T.S.", Electronic Product Design, Oct. 1980, p. 10.
Tarng, "On-Resistance Characterization of VDMOS Power Transistors", IEDM 81, pp. 429-431.

Primary Examiner—Martin H. Edlow
Assistant Examiner—Mark Prenty
Attorney, Agent, or Firm—Robert T. Mayer; Steven R. Biren

[57] ABSTRACT

A vertical MOS-FET device having a planar multicell structure which is constituted by an assembly of elementary cells of a polygonal form having a source zone, a shortcircuit region, a channel zone and a drain zone. In the space between adjoining apices of a number of elementary cells there are provided complementary elements having a construction similar to that of the previously-mentioned cells but having a polygonal form adapted to the configuration of the cells. Thus, the overall length of the channel zones per unit surface area can be optimized.

4 Claims, 2 Drawing Figures

VERTICAL MOS-FET DEVICES HAVING A PLANAR MULTICELL STRUCTURE

BACKGROUND OF THE INVENTION

The invention relates to a device of the vertical MOS-FET type having a planar multicell structure, which is provided in a semiconductor crystal and comprises an assembly of identical elementary cells in the form of a simple polygon, a shortcircuit region being located at the center of each of these cells and each cell having a first island diffused into a layer of a first conductivity type constituting the drain zone of the device, which island is highly doped with impurities of a second conductivity type opposite to the first conductivity type and defines inter alia at the surface of the layer the perimeter of the said drain zone and the form of the cell, and a second island which is locally diffused into the first island. The second island is highly doped with impurities of the first conductivity type, constitutes the source zone, and defines a channel zone located at the surface and mutually separating the second island and the layer of the first conductivity type, and also defines the central short circuit region.

It is known that according to the common solution used nowadays in the manufacture of MOS-FET power devices a planar so-called multicell structure is utilized which consists of a given number of elementary cells connected parallel in a semiconductor crystal and arranged adjacent each other and having a simple geometric form. For example, structures are already known comprising hexagonal cells, so-called "HEXFET" structures, and more recently so-called "SIPMOS" structures comprising square cells or "TRIMOS" structures comprising triangular cells.

These structures comprise a drain zone, a source zone and a channel zone and can be characterized on the one hand by a filling factor corresponding to the ratio:

$$\frac{P}{S} = \frac{\text{perimeter of the channel}}{\text{surface of the semiconductor crystal}}$$

and on the other hand by the value of their resistance $R_{ON}$ in the forward direction in the conductive state. With a given configuration, in structures operated at comparatively low voltages, the resistance $R_{ON}$ is mainly produced by the transverse resistance of the channel, whose value is inversely proportional to the perimeter of the channel, which is the reason why it is important to improve the filling factor P/S.

When considering this filling factor, it has been found that in all cases optimum dimensions exist as to the source zone located within each elementary cell, the ratio P/S being a maximum, which maximum is constant and is theoretically equal to 1/d (where d represents the distance μm between two adjacent source zones, which distance is determined in practice by admissible etching tolerances in the manufacture of the cells).

The examination of the filling factor in the various configurations has also shown that with an equal P/S the cell density is smaller in a structure constituted by triangular cells. In this structure, like in the other structures, the filling factor remains smaller than the value which is theoretically attainable. This is especially due to the fact that the etching tolerances required for the provision in and on the semiconductor crystal of the various elements of each cell lead either to the enlargement of the surface area of the elementary cells with respect to the source zone or to a reduction of the source zone with respect to the source zone of the elementary cell. In both cases, this means in fact that the distance d between the two source zones is increased and the channel perimeter is decreased.

This decrease of the value of the filling factor with respect to the theoretical value thereof is also due to the fact that in the contemporary structures, a shortcircuit region is formed in each elementary cell for defining the potential of the inversion zone, which shortcircuit region generally has a form which is equal to that of the elementary cell.

SUMMARY OF THE INVENTION

The invention has for its object to obviate these disadvantages. For this purpose, according to the invention, the device of the kind mentioned above is characterized in that there are formed in the space between the adjoining apices of a number of adjacent elementary cells complementary elements having a construction similar to that of the elementary cells and having a simple geometric form adapted to the configuration of the cells.

By addition of the complementary cells arranged between the elementary cells on the same crystal surface, the channel perimeter is enlarged and hence the P/S ratio is improved, which ratio now approaches very closely the theoretical maximum value.

The combination possibilities are large, such as in particular the combination of square elementary cells with complementary elements in the form of also square cells, but it has been found that, in order to satisfy the minimum etching conditions, such complementary elements can be added only if the distance between the elementary cells among each other have a minimum value of about 30 μm so that the P/S factor is improved only to a limited extent.

A preferred embodiment according to the invention is characterized in that the device comprises a combination of a triangular form for the elementary cells with a hexagonal form for the complementary elements. With such a combination, the P/S factor can be increased to more than 30% in the optimum conditions, in which the value of the diameter of the circle inscribed into the complementary hexagonal element is equal to the distance between the source zones of two adjoining triangular elementary cells.

In a further embodiment, the complementary elements are arranged so that their apices are located opposite to the apices of the elementary cells.

In another embodiment, the complementary elements are arranged so that their sides are located opposite to the apices of the elementary cells.

In this embodiment, which is particularly advantageous for the combination of triangular cells with hexagonal elements, a decrease of the maximum electrical field produced opposite to the apex of each of the triangles is obtained.

BRIEF DESCRIPTION OF THE DRAWING

In order that the invention may be carried out more readily, it will now be described more fully with reference to the accompanying drawing, in which.

It should be noted that, for the sake of clarity, the dimensions in the Figures are exaggerated and are not shown in proportion, and the insulating oxide layers and the contact surfaces are not shown in the plan view.

DESCRIPTION OF THE PREFERRED EMBODIMENTS

Figure 1:
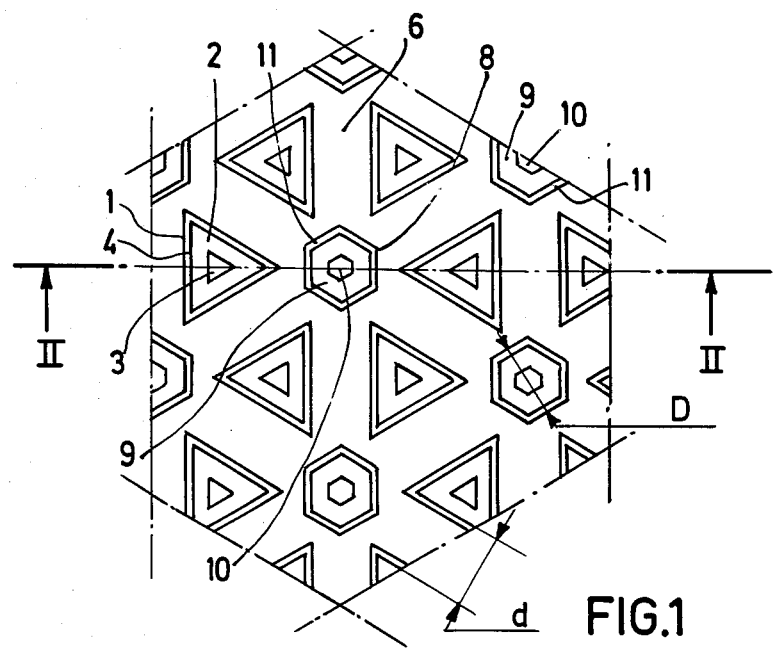
FIG. 1 is a plan view of a part of a device according to the invention in the preferred embodiment in which triangular elementary cells are combined with hexagonal complementary elements.
Figure 2:
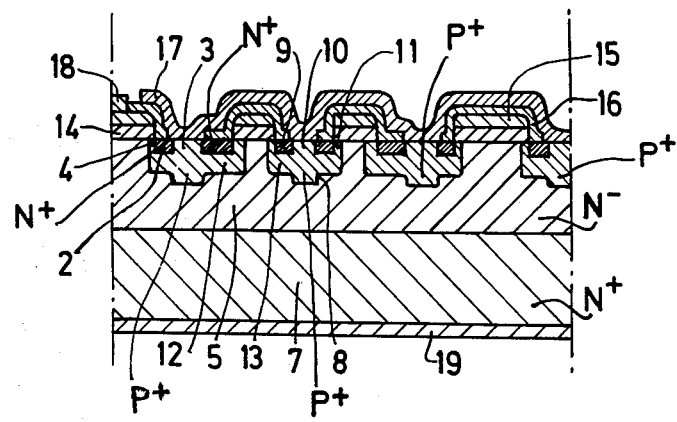
FIG. 2 is a diagrammatic sectional view taken on the line II—II of said part of the device.

According to FIGS. 1 and 2, an elementary triangular cell 1 according to the invention comprises an n+ type region 2 which is located at the surface and constitutes the source zone of a MOS transistor, which source zone is formed in a p+ type island within which are located on the one hand the shortcircuit region 3 and on the other hand the channel zone 4.

The form of the p+ type island, which is diffused into an n-type layer 5, defines a number of surface strips 6 which together with the remaining part of the layer 5 and the underlying substrate 7 constitute the drain zone of the MOS transistor.

In practice, this cell is reproduced in large numbers, as shown in FIGS. 1 and 2.

The elementary cells are arranged so that sufficiently large spaces are present between the cells, in which spaces—in accordance with the invention—the complementary elements 8 are provided. These complementary elements 8 have a construction similar to that of the elementary cells 1 and thus comprise a source zone 9 limiting a shortcircuit region 10 and a channel zone 11.

In order to obtain this combination of elementary cells and complementary elements, the semiconductor substrate 7, for example of silicon and preferably of the n+ type, is provided on which a layer 5, which is of the same conductivity type but has a lower concentration of impurities (of the n-type), is grown epitaxially.

In a preferred embodiment, after the oxide layer covering the surface of the layer 5 has been etched away in a suitable manner, the deep islands 3 and 10 of a second conductivity type opposite to the first conductivity type and having a high concentration of doping impurities, of the p+ type, are diffused; through new windows etched into the same oxide layer, the p+ type islands 12 and 13, whose depth is smaller than that of the islands 3 and 10, and within these islands 12 and 13 new n+ type islands 2 and 9, are successively diffused. The shortcircuit regions 3 and 10 and the channel zones 4 and 11 are limited by the lateral diffusion of the islands 12, 13 and 2, 9.

The form of the etching masks for the islands 12, 13, 2, 9 also defines the location of the drain zone.

When the islands 3, 10 are provided straight below the shortcircuit region at a larger depth than the islands 12, 13, the voltage behavior of the device is improved by reducing the radius of curvature of the transition.

This result can be attained by the use of a double diffusion process, but it is alternatively possible to diffuse simultaneously, through a single mask, impurities of different kinds and at different diffusion rates, the diffusion of each of these impurities being limited to the zones which correspond to the islands 3, 10, 12, and 13.

The following processing steps, i.e. the vapor deposition of a pure oxide layer 14 and of a layer 15 of polycrystalline silicon constituting the gate electrode, the vapor deposition of a new insulating layer 16 and the vapor deposition of metal contact layers 17, 18 and 19 on the source zone, the gate region and the drain zones, respectively, are carried out according to known methods and with the aid of known means. Preferably, the diameter D of the circle inscribed into the hexagonal complementary element 8 is equal to the distance d between two adjoining source zones, this distance d being kept constant throughout the device. In this manner, a P/S ratio is obtained which approaches very closely the theoretically attainable value.

In a further preferred embodiment, the oxide layers 14 and the poly layers 15 are vapor-deposited before the various p- and n-type islands are provided in the layer 5 and then serve as masks for the diffusion of the said islands.

What is claimed is:

1. A vertical MOS-FET semiconductor device having a planar multicell structure, which comprises:
   a semiconductor body;
   a layer of a first conductivity type at the surface of said body which comprises the drain zone of said MOS-FET device;
   a plurality of identical elementary cells, each in triangular form, each cell comprising a first highly-doped island of the second conductivity type in said layer which defines the form of said cell and a second highly-doped island of the first conductivity type in said first island, said second island being in the shape of a loop and having said triangular form, and said second island comprising the source zone of said MOS FET device;
   a shortcircuit region in the center of the loop of said second island adjacent the surface of said device, at which region said first and second islands are connected together;
   a channel zone formed adjacent said surface between the outer perimeter of said second island and the perimeter of said first island;
   a gate region extending over said channel region; and
   means for optimizing the overall length of said channel zone per unit of surface area (filling factor), which comprises a plurality of identical complementary cell elements, each having a construction similar to that of said elementary cells and having an hexagonal form, said complementary cell elements being located between adjoining apices of adjacent elementary cells.

2. A device as claimed in claim 1, characterized in that the complementary cell elements are arranged so that their apices are located opposite apices of the elementary cells.

3. A device as claimed in claim 1, characterized in that the complementary cell elements are arranged so that their sides are located opposite to apices of the elementary cells.

4. A device as claimed in claim 1, characterized in that the diameter (D) of a circle inscribed into the complementary cell element is equal to a distance (d) between the source zones of the two adjoining elementary cells.

* * * * *